United States Patent
Hikmet et al.

(10) Patent No.: US 11,882,651 B2
(45) Date of Patent: Jan. 23, 2024

(54) STABLE PCB FOR SOLID STATE LIGHT SOURCE APPLICATION

(71) Applicant: SIGNIFY HOLDING B.V., Eindhoven (NL)

(72) Inventors: Rifat Ata Mustafa Hikmet, Eindhoven (NL); Ties Van Bommel, Horst (NL); Grigory Onushkin, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 94 days.

(21) Appl. No.: 17/612,985

(22) PCT Filed: May 13, 2020

(86) PCT No.: PCT/EP2020/063285
§ 371 (c)(1),
(2) Date: Nov. 19, 2021

(87) PCT Pub. No.: WO2020/234074
PCT Pub. Date: Nov. 26, 2020

(65) Prior Publication Data
US 2022/0217838 A1     Jul. 7, 2022

(30) Foreign Application Priority Data
May 23, 2019  (EP) .................................... 19176120

(51) Int. Cl.
*H05K 1/02*     (2006.01)
*F21V 29/503*   (2015.01)
(Continued)

(52) U.S. Cl.
CPC ....... *H05K 1/0274* (2013.01); *F21V 19/0025* (2013.01); *F21V 29/503* (2015.01);
(Continued)

(58) Field of Classification Search
None
See application file for complete search history.

(56) References Cited

U.S. PATENT DOCUMENTS

| 2004/0009309 A1 | 1/2004 | Raksha et al. |
| 2009/0141505 A1 | 6/2009 | Ushiki et al. |

(Continued)

FOREIGN PATENT DOCUMENTS

| JP | 2007317981 A |   | 12/2007 |
| JP | 2012023309 A | * | 2/2012  |

(Continued)

OTHER PUBLICATIONS

Kato et al., "Light-Emitting Device and Planar Lighting Device", Feb. 2, 2012, English Translation of JP 2012023309 A, merged translation text followed by 14 pages of document image. (Year: 2012).*

*Primary Examiner* — Alan B Cariaso

(57) ABSTRACT

The invention provides a lighting device (1000) comprising (i) a light source (100) configured to generate light source light (101), wherein the light source (100) comprises a solid state light source, and (ii) a support (200) configured to support the light source (100), wherein the support (200) comprises a metal based thermally conductive material (201), wherein the lighting device (1000) further comprises (iii) a layered element (300), configured in physical contact with the support (200), wherein the layered element (300) comprises one or more layers (310), wherein the layered element (300) at least comprises an electrically insulating first layer (311), wherein at least part of the layered element (300) is configured between the light source (100) and the support (200) such that during operation part of the light source light (101) irradiates the layered element (300), wherein the layered element (300) comprises light reflective (Continued)

particles (410), wherein at least 50 wt. % of the particles have a flake-like shape.

15 Claims, 8 Drawing Sheets

(51) Int. Cl.
*F21V 19/00* (2006.01)
*H05K 1/05* (2006.01)
*F21Y 115/10* (2016.01)

(52) U.S. Cl.
CPC ............ *H05K 1/0203* (2013.01); *H05K 1/056* (2013.01); *F21Y 2115/10* (2016.08); *H05K 2201/0224* (2013.01); *H05K 2201/0245* (2013.01); *H05K 2201/10106* (2013.01); *H05K 2201/2054* (2013.01)

(56) References Cited

U.S. PATENT DOCUMENTS

| | | | |
|---|---|---|---|
| 2010/0187987 A1* | 7/2010 | Nakamura | H10K 50/854 |
| | | | 313/504 |
| 2011/0043106 A1* | 2/2011 | Higashikawa | H01J 11/44 |
| | | | 257/E33.072 |
| 2011/0132644 A1 | 6/2011 | Nishi et al. | |
| 2011/0204407 A1* | 8/2011 | Cupta | C09K 19/3809 |
| | | | 257/E33.072 |
| 2011/0290543 A1 | 12/2011 | Takeuchi et al. | |
| 2012/0138990 A1* | 6/2012 | Sato | H01L 33/641 |
| | | | 257/E33.068 |
| 2012/0138997 A1* | 6/2012 | Tasaki | H01L 33/60 |
| | | | 427/322 |
| 2012/0193666 A1* | 8/2012 | Namiki | C08G 18/8175 |
| | | | 257/E33.057 |
| 2014/0327024 A1 | 11/2014 | Ishihara et al. | |
| 2015/0104573 A1 | 4/2015 | Wosylus et al. | |
| 2017/0066926 A1 | 3/2017 | Frantz et al. | |

FOREIGN PATENT DOCUMENTS

| | | |
|---|---|---|
| JP | 2012037829 A | 2/2012 |
| JP | 2018207047 A | 12/2018 |
| WO | 2017169262 A1 | 10/2017 |
| WO | 2017208726 A1 | 12/2017 |

\* cited by examiner

STABLE PCB FOR SOLID STATE LIGHT SOURCE APPLICATION

CROSS-REFERENCE TO PRIOR APPLICATIONS

This application is the U.S. National Phase application under 35 U.S.C. § 371 of International Application No. PCT/EP2020/063285, filed on May 13, 2020, which claims the benefit of European Patent Application No. 19176120.4, filed on May 23, 2019. These applications are hereby incorporated by reference herein.

FIELD OF THE INVENTION

The invention relates to a lighting device comprising (i) a light source configured to generate light source light and (ii) a support configured to support the light source. The invention also provides a lamp or luminaire, comprising such lighting device.

BACKGROUND OF THE INVENTION

An insulation film coated and formed as a protective film in a printed-wiring board is known in the art. US2009/0141505 indicates in relation to such film that in addition to characteristics such as solvent resistance, hardness, solder resistance and electrical insulating properties generally required in a solder resist film, an excellent light reflectivity capable of utilizing emission of LED effectively has been desired. US2009/0141505 describes e.g. a white heat-hardening resin composition comprising rutile-type titanium oxide; and a heat-hardening resin.

SUMMARY OF THE INVENTION

Chip scale packaged (CSP) LEDs are being increasingly used in various applications because of its robust structure and attractive pricing. As opposed to the packaged LEDs, a CSP LED is placed directly on top of the printed circuit board (PCB). In the case of packaged LEDs, the presence of the package may stop blue light reaching the PCB. In the case CSP high intensity light from the CSP may reach the surface of the PCB. PCBs with high thermal conductivity have a metal (aluminum) base with an epoxy dielectric layer on top it below the copper tracks. During the operation of the CSP LEDs (blue) light from the LEDs fall onto the PCB light goes through the solder resist layer and reaches the dielectric layer. By the high intensity light both solder resist layer but most importantly the dielectric layer may degrade. As a result of degrading dielectric layer short circuiting between the metal substrate and the copper tracks may take place.

Hence, it is an aspect of the invention to provide an alternative lighting system, which preferably further at least partly obviates one or more of above-described drawbacks. The present invention may have as object to overcome or ameliorate at least one of the disadvantages of the prior art, or to provide a useful alternative.

In a first aspect, the invention provides a lighting device ("device") comprising (i) a light source configured to generate light source light and (ii) a support configured to support the light source. Especially, in embodiments the light source and the support are configured such that part of the light source light during operation is directed to the support. Further, in embodiments the support comprises a metal based thermally conductive material. Especially, the lighting device further comprises (iii) a layered element, configured in physical contact with the support. In embodiments, the layered element comprises one or more layers. Especially, the layered element may at least comprise an electrically insulating first layer (herein also indicated as "dielectric layer"). At least part of the layered element may be configured between the light source and the support such that during operation (the) part of the light source light may irradiate the layered element. Especially, the layered element comprises light reflective particles. In specific embodiments, at least 30 wt. % (more especially at least 50 wt. %, yet even more especially at least 70 wt. %) of the particles have a flake-like shape (such as flakes). Hence, in embodiments the invention provides a lighting device comprising (i) a light source configured to generate light source light and (ii) a support configured to support the light source, wherein the support comprises a metal based thermally conductive material, wherein the lighting device further comprises (iii) a layered element, configured in physical contact with the support, wherein the layered element comprises one or more layers, wherein the layered element at least comprises an electrically insulating first layer, wherein at least part of the layered element is configured between the light source and the support such that during operation (the) part of the light source light irradiates the layered element, wherein the layered element comprises a layer of light reflective particles, wherein at least 30 wt. % (more especially at least 50 wt. %, yet even more especially at least 70 wt. %) of the particles have a flake-like shape and wherein the layer is an essentially closed layer of aligned flake-like shaped particles. Hence, in embodiments the light source and the support may be configured such that part of the light source light during operation is directed to the support.

With such lighting device, the layer on the support may receive light source light from the light source, but may essentially not deteriorate as a substantial part of the light source light is reflected (by the flakes). It appears that using e.g. $TiO_2$ particles, the above-indicated problem may not easily be solved, whereas using flakes, such as alumina flakes, the above-indicated problem may be solved.

As indicated above, the lighting device especially comprises (i) a light source configured to generate light source light and (ii) a support configured to support the light source.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . The term "light source" may also refer to an organic light-emitting diode, such as a passive-matrix (PMOLED) or an active-matrix (AMOLED). In a specific embodiment, the light source comprises a solid state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. The term "light source" may also refer to a chip scaled package (CSP). A CSP may comprise a single solid state die with provided thereon a luminescent material comprising layer. The term "light source" may also refer to a midpower package. A midpower package may comprise one or more solid state die(s). The die(s) may be covered by a luminescent material comprising layer. The die dimensions may be equal to or smaller than 2 mm, such as in the range of e.g. 0.2-2 mm. Hence, in embodiments the light source comprises a solid state light source. Further, in specific embodiments, the light source comprises a chip scale packaged LED. Herein, the term "light source" may also especially refer to a small solid state light source, such as having a mini size or micro size. For instance, the light sources may comprise one or more of mini LEDs and micro LEDs. Especially, in embodiment the light sources comprise micro LEDs or "microLEDs" or "μLEDs". Herein, the term mini size or mini LED especially indicates to solid state light sources having dimensions, such as die dimension, especially length and width, selected from the range of 100 μm-1 mm. Herein, the term μ size or micro LED especially indicates to solid state light sources having dimensions, such as die dimension, especially length and width, selected from the range of 100 μm and smaller.

The phrases "different light sources" or "a plurality of different light sources", and similar phrases, may in embodiments refer to a plurality of solid state light sources selected from at least two different bins. Likewise, the phrases "identical light sources" or "a plurality of same light sources", and similar phrases, may in embodiments refer to a plurality of solid state light sources selected from the same bin.

The light source is a type of light source of which part of the light source light propagates in a direction away of the support, but part of the light source light also reaches the support. For instance, a solid state light source may have a die from which part of the light source light also escapes from the edge. In another example, the light source may be a solid state light source with a luminescent material covered die, where luminescent material light from the luminescent material may also reach the support. Hence, in embodiments the light source and the support are configured such that part of the light source light during operation is directed to the support.

The part of the light source light directed to the support may be smaller than the part of the light source light that is not directed to the support. For instance, only a minor part may be directed to the support (and reach the layer element). In embodiments, the part of the light source light that is not directed to the support may be less than 20%, such as especially less than 10%, of the total power of the light source light that escapes from the light source. Hence, during operation the part of the light source light that irradiates the layered element may be less than 20%, such as especially less than 10%, of the total power of the light source light that escapes from the light source. The light source (light) may have an optical axis essentially perpendicular to the support. Further, a substantial part, such as essentially all light source light, such as at least about 80%, such as especially at least 90% of the total power of the light source light that escapes from the light source may propagate in a direction away from the light source and support.

In the context of at least part of the light source light being directed to the support, it is noted that especially due to the spatial light distribution of the light source, especially the solid state light source, and may not due the presence of (remote) optics. Of course, optics for e.g. beam shaping the light source light may be available, however, still part of the light source light may in embodiments be directed to the support. Another (substantial) part may be beam shaped with the (remote) optics (and will be directed away from the support).

The term "remote" especially indicate that the optics is not in optical, and thus also not in physical, contact with a light emitting surface of the light source. The light emitting surface of the light source may e.g. be a solid state die or a surface of a luminescent material on such solid state die. The term "remote" may especially indicate at a distance of at least a wavelength of the light source light, such at a distance equal to or larger than the wavelength of a peak maximum of the light source light, such as at least 1.5 times such value. In embodiments, the distance is at least 1 μm, such as at least 2 μm, like at least 5 μm.

The support is configured to support the light source. Hence, in embodiments the light source is functionally coupled to the support. For instance, the light source may be soldered to the support. Hence, in embodiments the support may comprise one or more conductive tracks, to which the light source may be functionally coupled, such as physically and/or electrically conductively coupled. The conductive track may comprise or may be electrically conductively be coupled with electrodes.

In specific embodiments, the support comprises a metal based thermally conductive material. This thermally conducive material may be available in addition to electrically conductive material, such as copper. The electrically conducive material is especially available for providing an electrical circuit of which the light source is part.

Such support with thermally conductive material may be used to guide away thermal energy from the light source via the support, for instance to a heatsink.

A thermally conductive material may especially have a thermal conductivity of at least about 20 W/m/K, like at least about 30 W/m/K, such as at least about 100 W/m/K, like especially at least about 200 W/m/K (see also below).

In embodiments, the support comprises an aluminum based thermally conductive material. In embodiments, the support comprises an aluminum based thermally conductive material. Alternatively or additionally, in embodiments the support comprises a copper based thermally conductive material. Additionally or alternatively, other metals (solid at room temperature) may be used as well.

As known in the art, a printed circuit board may mechanically support and electrically connect electronic components or electrical components using conductive tracks, pads and other features etched from one or more sheet layers of copper laminated onto and/or between sheet layers of a non-conductive substrate (shortly indicated as "track" or "conductive track").

Hence, in embodiments a PCB may comprise an insulating layer (or dielectric layer) arranged between a substrate and a conductive layer.

An (electronic) component, such as a solid stage light source, may generally be soldered onto the PCB to both electrically connect and mechanically fasten it to the PCB. For instance, a basic PCB may consist of a flat sheet of insulating material and a layer of copper foil, laminated to the substrate. Chemical etching divides the copper into separate conducting lines called tracks or circuit traces, pads for connections, vias to pass connections between layers of copper, and features such as solid conductive areas for EM shielding or other purposes. The tracks function as wires fixed in place, and are insulated from each other by air and the board substrate material. The surface of a PCB may have a coating that protects the copper from corrosion and reduces the chances of solder shorts between traces or undesired electrical contact with stray bare wires. For its function in helping to prevent solder shorts, the coating is called solder resist.

Hence, the shape of a PCB may in general be plate-like. Especially, in embodiments the PCB may have a length and a width and a height, wherein an aspect ratio of the length and the height is at least 5, like in the range of 5-5000, like 10-2500, and wherein an aspect ratio of the width and the height is at least 2, such as an aspect ratio of at least 5, like in the range of 5-5000, like 10-2500. The terms "length", "width", and "height" may also refer to "largest length", "largest width", and "largest height", respectively. The PCB may especially have a rectangular cross-section (such as a square cross-section).

The height (or thickness) of the PCB may in embodiments be selected from the range of 0.2-10 mm, such as 0.5-5 mm, like 1-2 mm. The width of the PCB may in embodiments be selected from the range of 5-200 mm, such as 5-50 mm. The length of a single printed circuit board area may in embodiments e.g. be selected from the range of 10-50 mm, such as 15-40 mm. The length of the PCB, including a plurality of (connected) PCB areas, may in embodiments e.g. be selected from the range of 20-2000 mm, such as 20-1500 mm. Other dimensions may be possible as well.

In further embodiments, the functional component may comprise an electronic component, especially an electronic component selected from the group comprising a solid state light source, a driver, an electronic module, or a sensor. Especially, the electronic component may comprise a solid state light source.

In embodiments, the board may comprise a rigid board or a semi-rigid board, especially a rigid board. In other embodiments, the board may comprise a semi-rigid board. This may apply to all boards in the board panel arrangement.

In embodiments, the board may comprise a metal, especially a metal selected from the group comprising copper aluminum, tin, iron, silver and lead, more especially a metal selected from the group comprising copper and aluminum.

In further embodiments, the support, such as the (printed circuit) board, may have a thermal conductivity of at least 200 W/(m*K), especially at least 250 W/(m*K), such as at least 300 W/(m*K).

In specific embodiments, the board may comprise a printed circuit board. Especially, the board may comprise one or more of a CEM-1 PCE, a CEM-3 PCE, a FR-1 PCE, a FR-2 PCB, a FR-3 PCB, a FR-4 PCB, and aluminum metal core PCB, especially one or more of a CEM-1 PCB, a CEM-3 PCB, a FR-1 PCB, and a FR4 PCB and an aluminum metal core PCB, more especially one or more of a CEM-1 PCB, a CEM-3 PCB, a FR-1 PCB.

Especially, the PCB comprises a metal core PCB.

Therefore, in embodiments the printed circuit board comprises a thermally conductive material, such as aluminum.

In embodiments, a thin layer of thermally conductive but electrically insulating dielectric may be laminated between a metal base and a copper foil. The copper foil may be etched into the desired circuit pattern and the metal base draws heat away from this circuit through the thin dielectric. Hence, the support may in embodiments be a metal-based PCB (sometimes also indicated as metal core PCB).

Especially, the lighting device may (thus) further comprise (iii) a layered element, configured in physical contact with the support. The layered element comprises one or more layers. The support may have a support surface, to which the light source is associated. Over at least part, or even over essentially the entire, support surface, the layered element may be available. When two or more layers are available, these layers may especially be stacked. In this way, a stack may be formed from the support and the layer(s) (stack).

The layered element at least comprises an electrically insulating first layer. This electrically insulating layer may be configured to insulate the electrically conductors, such as e.g. copper tracks, from the thermal conductor which may also be electrically conductive. The electrically insulating first layer may be thermally conductive. However, the electrically insulating first layer may also comprise an essentially thermally non-conductive material. The electrically insulating layer may also comprise particles that improve thermal conductivity, while essentially not increasing the electrical conductivity.

A thermal insulator may e.g. have a thermal conductivity of equal to or less than 1 W/m/K.

An electrical insulator may have an electrical conductivity of equal to or less than $1 \cdot 10^{-10}$ S/m, especially equal to or smaller than $1 \cdot 10^{-13}$ S/m.

At least part of the layered element may be configured between the light source and the support. Hence, during operation part of the light source light may irradiate the layered element.

As indicated above, the layered element comprises light reflective particles. In specific embodiments, at least 30 wt. % (more especially at least 50 wt. %, yet even more especially at least 70 wt. %) of the particles have a flake-like shape. In yet more specific embodiments, at least 90 wt. %, more especially at least 95 wt. %, yet even more especially at least 98 wt. %, even more especially about 100 wt. %, of the particles have a flake-like shape (such as flakes). The higher the weight percentage of the flake-like shape particles, the better the packing of the flake structure may be, and thus the better the protection may be.

With the reflective particles, at least part of the light source light does not propagate in the direction of the support, as the light source light is reflected. However, would the light reflective particles be spherical, as e.g. in examples $TiO_2$ particles may be, a part of the light source light may still propagate in the direction of the support. In this way, at least part of the layer element may be degraded. This may lead to risks of electrical shortcutting. With the flakes however, it appears that an essentially closed layer of aligned flakes is possible. Thereby, essentially all light source light that is directed to the layered element is reflected back in a direction away from the support. Hence, with the present invention electrical shortcutting due to light-based degradation of the layered element may substantially be reduced.

As indicated above, at least 30 weight %, such as about at least 50 weight % of the particles may have a flake-like shape.

In embodiments the layer comprises at least 70 wt. % of the light reflective particles. In embodiments, the layered element may comprise a layer which comprises at maximum about 98 wt. % of the light reflective particles, such as at maximum about 95 wt. %, like at maximum about 90 wt. %.

In specific embodiments, the layer may have a particle concentration of at least 50 vol. %, such as at least 70 vol. %, more especially in embodiments at least 90 vol. %. Hence, part of the layered element may have a relatively high concentration of the flake-like shaped particles. In embodiments, the layer may have a particle concentration of at maximum about 98 vol. %, such as at maximum about 95 vol. %, such as at maximum about 90 vol. %, or even lower.

For reflective purposes, the higher the content of the (flake-like) particles, the better.

As indicated above, in embodiments, the layer element may comprise an epoxide layer comprising the reflective particles.

Epoxy may comprise two components such as molecules with epoxy groups and molecules with amine groups. It is also possible to use molecules with anhydride groups to obtain cross-linked. It is also possible to use photopolymerizable epoxy using photo acid generators. In addition or alternatively to epoxy, other cross-linkable polymers such as one or more of acrylates, polyester and polyurethanes can also be used. Alternatively or additionally, an organic-inorganic materials, such as a sol-gel system, may be used. All these materials may be applied as matrix material for the particles, such as the flakes.

In specific embodiments, wherein the layered element may comprise the electrically insulating first layer and a solder resist comprising second layer, the insulating layer may be configured between the support and the solder resist comprising second layer. In such embodiments, the solder resist comprising second layer may comprise the light reflective particles. The solder-resist layer may e.g. comprise an epoxy resin filled with reflective particles, such as the herein described particles (and/or e.g. $TiO_2$ particles)).

Alternatively or additionally, the electrically insulating first layer may comprise the light reflective particles.

The material compositions of the insulating layer and the solder resist layer are especially different, as known to a person skilled in the art.

The insulating layer and/or the solder resist layer may each comprise a heat-hardening resin composition, with especially one or both of them comprising the herein described flake-like particles.

Hence, in embodiments an electrically insulating first layer may comprise at least part of the total number of light reflective particles. Alternatively or additionally, a solder resist comprising second layer may comprise at least part of the total number of light reflective particles. More especially, in embodiments the electrically insulating first layer comprises the light reflective particles. Alternatively, in embodiments the solder resist comprising second layer comprises the light reflective particles. When light reflective particles are available in different layers, the particles may be essentially the same, or may differ (in terms of particle size and/or particle materials).

The aspect of reflectivity may especially be relevant in a region around the light source. Hence, in embodiments the layered element comprises a layered element part configured adjacent to the light source, wherein the layered element part comprises at least part of the total number of particles, such as at least part of the (at least 30 wt. % of) the particles having the flake-like shape. Such element part may e.g. have an equivalent circular cross-section of at least 4 $mm^2$, like at least 25 $mm^2$, such as in the range of 100 $mm^2$ or more. Hence, in embodiments the light reflective particles may be configured adjacent to the light source.

The aspect of reflectivity may in embodiments also be relevant in a region below the light source, i.e. in embodiments wherein there is space between at least part of the light source and a layer with which the light source is physically connected. For instance, the light source may be physically connected to an insulating layer (especially the electrically insulating first layer). This physical coupling may e.g. be via two (or more) electrode contacts from the light source with two (or more), respectively, electrodes. This may provide a space, e.g. (essentially) defined in embodiments by the light source and the layer element, and also the electrodes (and electrode contacts). Hence, the lighting device may further comprise two or more electrodes. The light source and the two or more electrodes may be functionally coupled. Between the two or more electrodes there is a space, especially comprising an essentially electrically non-conductive material. Hence, in embodiments at least part of the one or more layers occupy at least part of the space. This part of the one or more layers may (also) comprise light reflective particles. Therefore, in embodiments the lighting device may further comprise two or more electrodes, wherein the light source and the two or more electrodes are functionally coupled, wherein between the two or more electrodes there is a space, wherein at least part of the one or more layers occupy at least part of the space, wherein the at least part of the one or more layers occupying the at least part of the space comprises at least part of the total number of light reflective particles.

Hence, in embodiments the insulating first layer (such as e.g. a layer between the electrodes and the support) may comprise the light reflective particles. Alternatively or additionally, the solder resist layer may comprise the light reflective particles. Alternatively or additionally, a layer with light reflective particles may be applied on top of (part of) the electrodes around the solid state light source, and/or or as underfill; such layer may e.g. be the insulating first layer.

As indicated above, the particles are indicated as light reflective particles. Especially, the particles are reflective for at least part of the light source light. Hence, one or more wavelengths of the light source light may be reflected by the flakes.

The light source may be configured to generate (at least) visible light and/or UV light source light. The terms "UV" or "UV light", and similar terms, may herein refer to a wavelength selected from the range of 100-380 nm. Instead of the term "UV light", and similar terms, also the term "UV radiation" may be applied. The terms "light" and "radiation" may herein refer to the same. The terms "visible", "visible light" or "visible emission" and similar terms refer to light having one or more wavelengths in the range of about 380-780 nm.

Hence, in embodiments the light source may be configured to generate light source light having a wavelength selected from the range of 100-780 nm, such as selected from the range of 200-7800 nm, especially having a wavelength selected from the range of 100-500 nm, such as selected from the range of 200-500 nm, like selected from the range of 230-500 nm.

In embodiments, the particles are reflective for at least part of the visible light and/or UV light. Hence, in embodiments the particles may be reflective for light having one or more wavelengths selected from the range of 100-780 nm, such as 200-780 nm. In embodiments, the particles are reflective for at least part of the infrared light, especially at least part of the light having one or more wavelengths selected from the range of 780-1400 nm (essentially near infrared). In embodiments, the particles are reflective for one or more wavelengths of the light source light.

In embodiments, the term "reflective" may indicate that at least 25%, especially at least 40%, like at least 50%, such as at least 60%, of the light is reflected. For instance, averaged for each wavelength (i.e. wavelength averaged), the reflection may be at least 25%, such as at least 40%, like at least 50%, such as at least 60%, or even higher.

As the particles have a flake-like shape, and may be aligned, the reflection may be at least partly, or even be substantially specular.

Particles having a flake-like shape are herein also indicated as flake-like particles. A particle having a flake-like shape may essentially be flake shaped.

In embodiments, the particles may have a particle length (L1), a particle height (L2), and a particle width (L3).

The at least 30 wt. % (more especially at least 50 wt. %, yet even more especially at least 70 wt. %, even at least 90 wt. %) of the particles (having a flake-like shape) may especially have a first aspect ratio AR1 defined as the ratio of the particle length (L1) and the particle height (L2), wherein AR1≥50, such as AR1≥100, or even AR1≥200. Fr instance, in embodiments AR1≥250, such as even AR1≥500. In embodiments, AR1≤10,000. The larger the ratio, the better the alignment and/or formation of a closed layer with specular reflective properties may be.

Alternatively or additionally, at least 30 wt. % (more especially at least 50 wt. %, yet even more especially at least 70 wt. %) of the particles (having a flake-like shape) may especially have a second aspect ratio AR2 of the particle length (L1) and the particle width (L3), wherein 1<AR2≤5, such as 1<AR2≤3, or even 1≤AR2≤2. Hence, the particles may have a length and a width that may be in the same range, or even essentially identical, whereas the height is much smaller than the length or the width.

In embodiments, for the at least 30 wt. % (more especially the at least 50 wt. %, yet even more especially the at least 70 wt. %) the length (L1) and the width (L3) may individually be selected from the range of 10-1000 µm, such as from the range of 30-500 µm, especially 40-400 µm, even more especially 50-500 µm.

Alternatively or additionally, in embodiments for the at least 30 wt. % (more especially at least 50 wt. %, yet even more especially at least 70 wt. %) the particle height (L2) may be selected from the range of 20-500 nm, especially 40-300 nm, even more especially 50-200 nm, such as in specific embodiments 60-150 nm.

In embodiments, for at least 30 wt. % of the particles AR1≥50, especially for at least 30 wt. % of the flake-like particles. In embodiments, for at least 30 wt. % of the particles 1≤AR2≤5, especially for at least 30 wt. % of the flake-like particles. In embodiments, for at least 30 wt. % of the particles the length (L1) and the width (L3) may individually be selected from the range of 10-1000 µm, especially for at least 30 wt. % of the flake-like particles. In embodiments, for at least 30 wt. % of the particles the particle height (L2) may be selected from the range of 20-500 nm, especially for at least 30 wt. % of the flake-like particles.

The phrase "individually selected" and similar phrases in this context indicate that the length and the width may be the same, but may also be different, but may both nevertheless be choses from the same (indicated) range. Especially, with these sizes a relatively dense layer may be obtained. Further, with especially these sizes, the particles may be packed in a desirable way ("leafing").

In embodiments, the particles, especially the flakes, may have a thickness selected from the range of about 50-200 nm, a length selected from the range of about 50-500 µm, and a width selected from the range of about 50-500 µm.

In specific embodiments, the particles have shapes selected from one or more of coin shapes and flake shapes. Especially, flake shaped particles may provide a better leafing than coin shaped particles.

Good results were obtained with aluminum particles, which have an oxidized outer layer. The layer reduces or even prevents electrical conduction of such flakes and also provides reflectivity. Hence, in embodiments the at least 30 wt. % (more especially at least 50 wt. %, yet even more especially at least 70 wt. %) of the particles comprise aluminum particles having an aluminum oxide outer layer.

In embodiments, at least 30 wt. % of the particles comprise aluminum particles having an aluminum oxide outer layer, especially at least 30 wt. % of the flake-like particles comprise aluminum particles having an aluminum oxide outer layer.

As indicated above, the term "light source" may also refer to a plurality of light sources. Hence, in embodiments the lighting device may also comprise the support with a plurality of light sources, which are all functionally coupled to the support. Essentially the same essentially continuous) layer element may be on the support configured between the light emitting surfaces of the light source(s) and the support.

In yet a further aspect, the invention provides a lamp comprising the lighting device or a luminaire comprising the lighting device. Such lamp or luminaire may comprise a plurality of light sources. Such lamp or luminaire may comprise a plurality of lighting devices.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, or LCD backlighting.

In alternative embodiments, instead of a support comprising a metal based thermally conductive material, the support may comprise (a PCB comprising) a FR-2, phenolic paper or phenolic cotton paper, paper impregnated with a phenol formaldehyde resin, FR-4, a woven fiberglass cloth impregnated with an epoxy resin, Kapton, UPILEX, or polyimide foil. In yet alternative embodiments, instead of a support comprising a metal based thermally conductive material, the support may comprise (a PCB comprising) a ceramic body, such as alumina or garnet (like $Y_3Al_5O_{12}$).

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Figure 1:
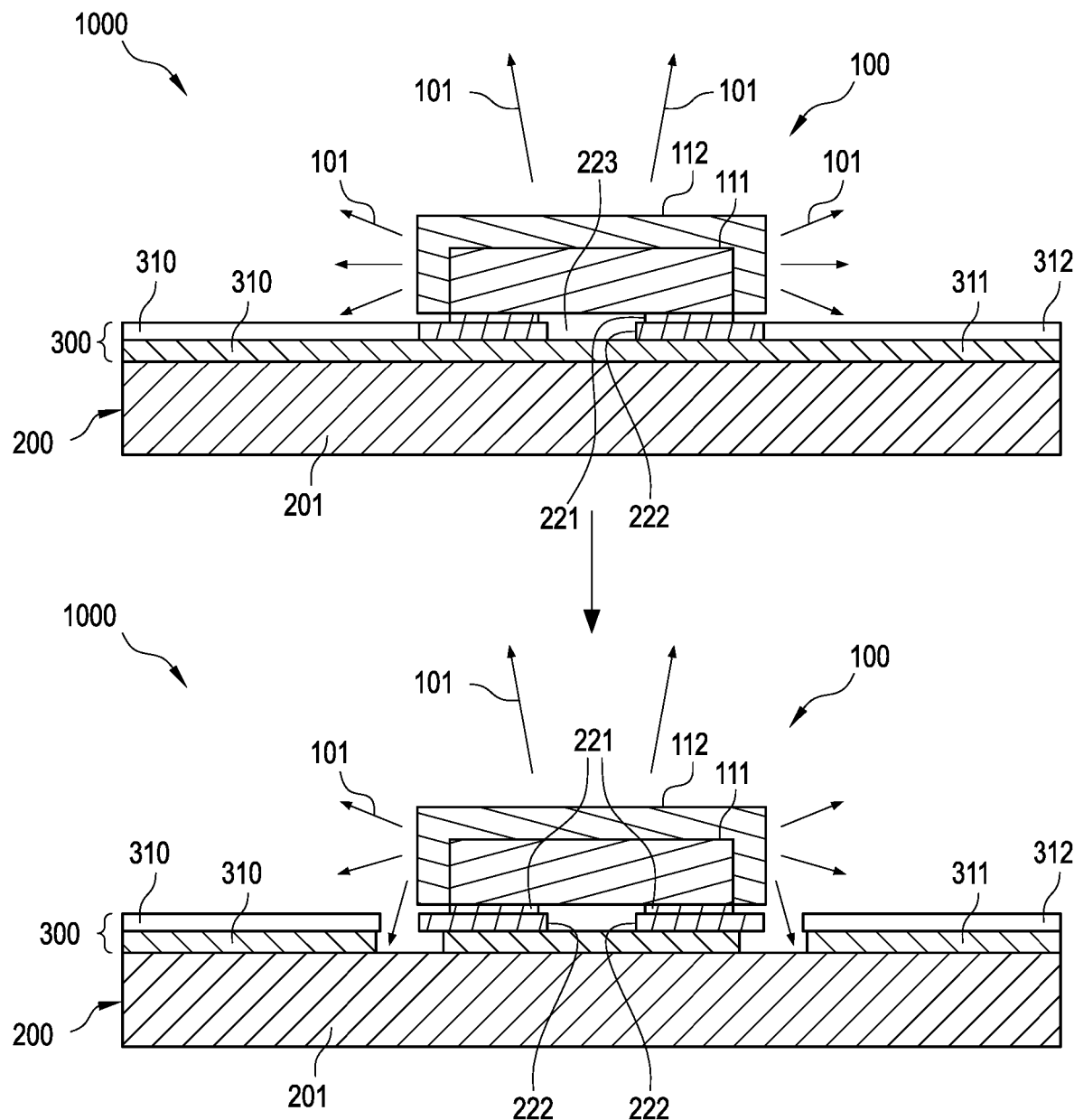
FIG. 1 schematically depict some aspects of the invention and described problem.

FIG. 1 schematically depicts the impact which light source light may have on a layer adjacent to the light source.

Here below, FIG. 1 is described in relation to a Chip scale packaged (CSP) LED. However, the invention is not limited to CSP light sources.

Chip scale packaged (CSP) LEDs are being increasingly used in various applications because of its robust structure and attractive pricing. As opposed to the packaged LEDs, a CSP LED is placed directly on top of the printed circuit board (PCB). In the case of packaged LEDs the presence of the package stops blue light reaching the PCB. In the case CSP high intensity light from the CSP reaches the surface of the PCB. PCBs with high thermal conductivity have a metal (aluminum) base with an epoxy dielectric layer on top it below the copper tracks. Reflective solder resist layer containing reflective particles are present on the surface of the PCB except for the areas reserved for soldering the LEDs. During the operation of the CSP LEDs blue light from the LEDs fall onto the PCB light goes through the solder resist layer and reaches the dielectric layer. By the high intensity light both solder resist layer but most importantly the dielectric layer degrades. As a result of degrading dielectric layer short circuiting between the metal substrate and the copper tracks takes place.

In order to solve this problem, we suggest the use high-aspect ratio metal flakes (aluminum, silver, copper, etc.) in epoxy. As opposed to $TiO_2$ containing material, which is currently used, aluminum flakes when overlapping can totally shield the light preventing it from reaching the dielectric layer underneath. In this way a reliable metal core PCB to be used in combination with CSP LEDs can be produced. Aluminum flakes also show better reflectivity then thin layers of TiOx.

FIG. 1 schematically shows in the upper part an embodiment of a build-up of e.g. a metal core PCB with a CSP soldered on to it. The lower part of FIG. 1 shows the places where the resist and the dielectric degrade are shown.

FIG. 1 schematically depicts an embodiment of lighting device 1000 comprising a light source 100 configured to generate light source light 101, and a support 200 configured to support the light source 100. The light source 100 may in embodiments comprise a solid state light source.

As schematically depicted, the light source 100 and the support 200 are configured such that part of the light source light 101 during operation may be directed to the support 200.

In specific embodiments, the support 200 may comprise a metal based thermally conductive material 201.

Especially, the lighting device 1000 may further comprise a layered element 300. The layered element 300 is configured in physical contact with the support 200. The layered element 300 comprises one or more layers 310. When two or more layers 310 are available, these may be stacked.

The layered element 300 may at least comprise an electrically insulating first layer 311, especially for electrically isolating the light source from the support 200. At least part of the layered element 300 may be configured between the light source 100 and the support 200 such that during operation part of the light source light 101 irradiates the layered element 300.

Reference 222 indicates electrodes and reference 221 indicate electrode contacts of the light source 100. Hence, the lighting device 1000 may further comprise two or more electrodes 222, wherein the light source 100 and the two or more electrodes 222 are functionally coupled (via the electrode contacts 221). As schematically indicated, between the two or more electrodes 222 there is a space 223.

Reference 312 indicates a second layer, such as e.g. a solder resist comprising second layer.

Reference 111 indicates e.g. the surface of a solid state light source die, like a LED die. From this die, solid state light source light may escape. Optionally, luminescent material may be provided, which is available between at least part of the surface 111 of a solid state light source die and the surface 112 of the luminescent material. From the latter surface 112, light source light may escape and luminescent material light may escape, or essentially only luminescent material light may escape. A luminescent material may convert light of a solid state light source, such as a LED, into luminescent material light. Hence, reference 112 indicates in fact a light emitting surface (of the light source 100). Would the luminescent material not be available, then reference 111 would be the light emitting surface of the light source 100.

Hence, herein it is proposed to use light reflective particles, especially flakes, in the layer(s) on the support 200. Here below, first some aspects of particles are discussed.

Figure 2A:
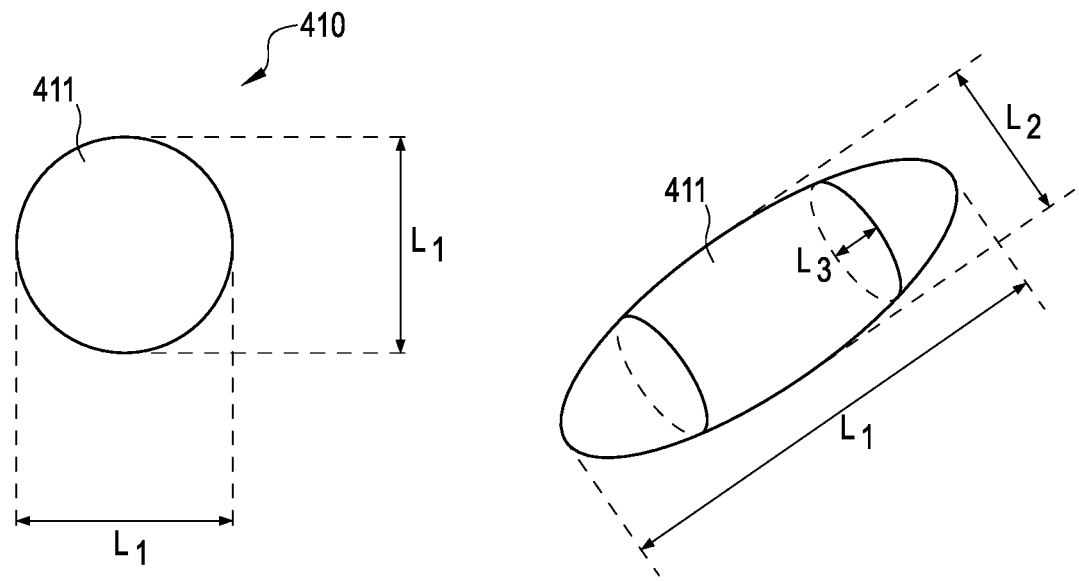
FIGS. 2a-2f schematically depict some aspects of embodiments of particles, with some of the shapes being depicted for reference purposes.

FIG. 2a schematically depicts for the sake of understanding particles and some aspects thereof. Note that the particles used in the present invention are especially relatively flat, see e.g. FIGS. 2c, and 2e.

The particles comprise a material 411, or may essentially consist of such material 411. The particles 410 have a first dimension or length L1. In the left example, L1 is essentially the diameter of the essentially spherical particle. On the right side a particle is depicted which has non spherical shape, such as an elongated particle 410. Here, by way of example L1 is the particle length. L2 and L3 can be seen as width and height. Of course, the particles may comprise a combination of differently shaped particles.

FIGS. 2b-2f schematically depict some aspects of the particles 410. Some particles 410 have a longest dimension A1 having a longest dimension length L1 and a shortest dimension A2 having a shortest dimension length L2. As can be seen from the drawings, the longest dimension length L1 and the shortest dimension length L2 have a first aspect ratio larger than 1.

Figure 2B:
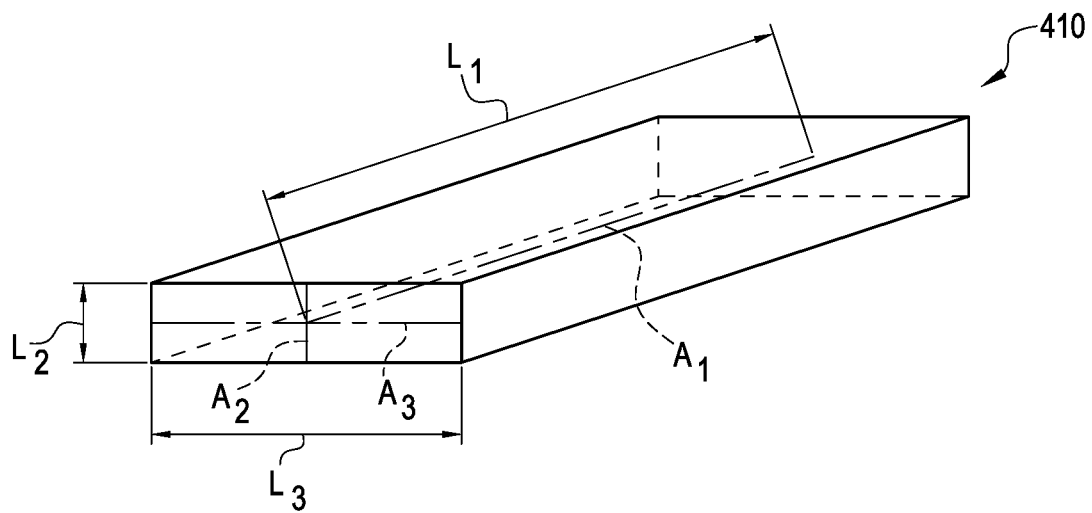

FIG. 2b schematically depicts a particle 410 in 3D, with the particle 410 having a length, height and width, with the particle (or flake) essentially having an elongated shape. Hence, the particle may have a further (minor or main) axis, herein indicated as further dimension A3.

Essentially, the particles 410 are thin particles, i.e. L2<L1, especially L2<<L1, and L2<<L3.

Figure 2C:
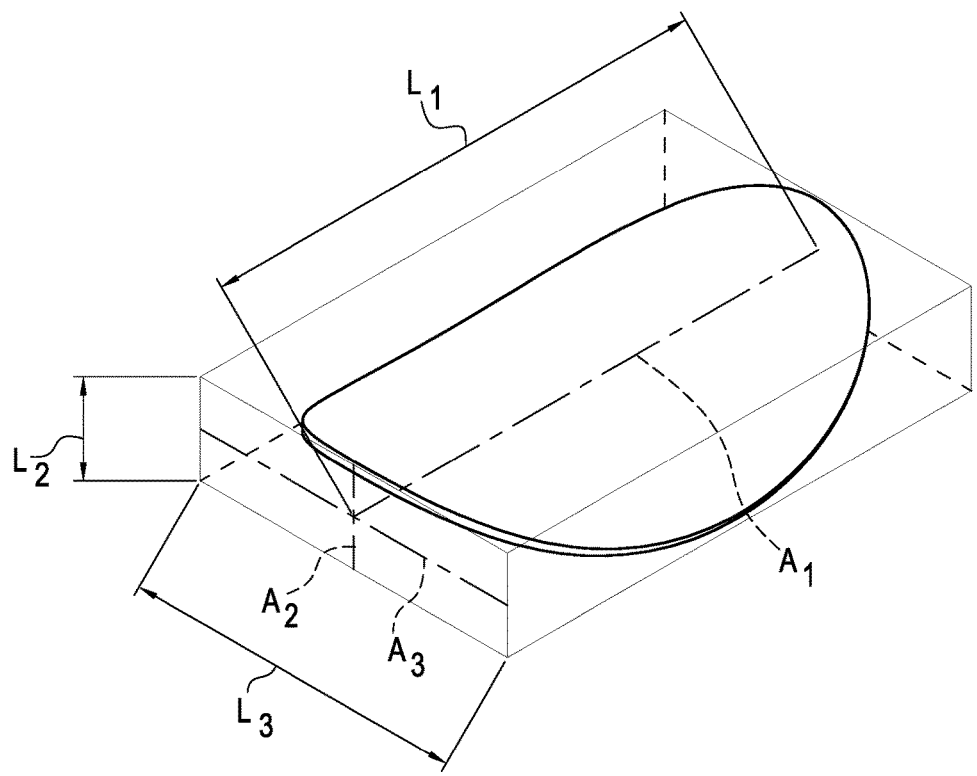

FIG. 2c schematically depicts a particle that has a less regular shape, with a virtual smallest rectangular parallelepiped enclosing the particle.

Note that the notations L1, L2, and L3, and A1, A2 and A3 are only used to indicate the axes and their lengths, and that the numbers are only used to distinguish the axis. Further, note that the particles are not essentially oval or rectangular parallelepiped. The particles may have any shape with at least a longest dimension substantially longer than a shortest dimension or minor axes, and which may essentially be flat. Especially, particles are used that are relatively regularly formed, i.e. the remaining volume of the fictive smallest rectangular parallelepiped enclosing the particle is small, such as less than 50%, like less than 25%, of the total volume.

Figure 2D:
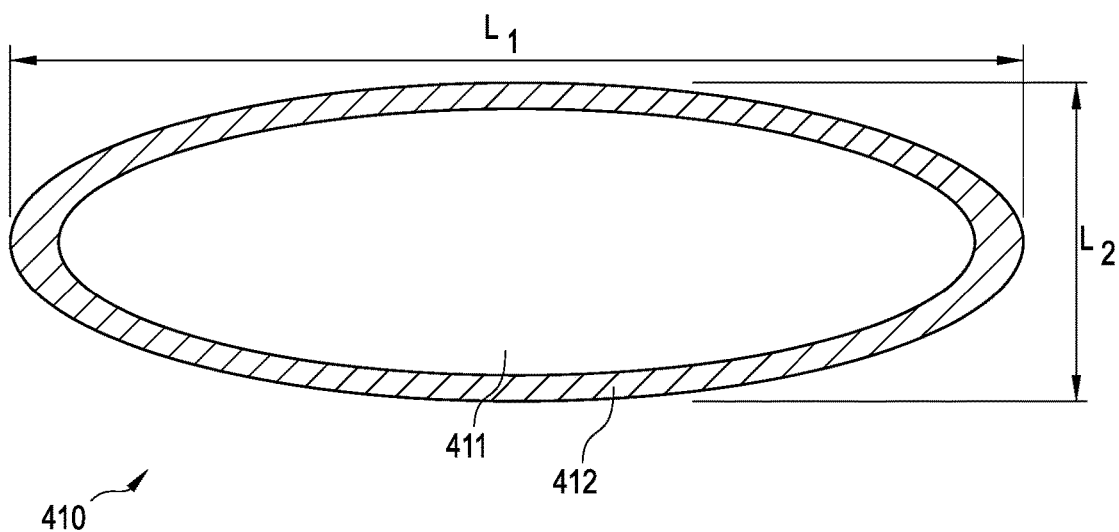

FIG. 2d schematically depicts in cross-sectional view a particle 410 including a coating 412. The coating may comprise light reflective material. For instance, the coating may comprise a (white) metal oxide. In other embodiments, the coating may essentially consist of a metal, such as an Ag coating. In other embodiments the coatings may only be on one or both of the large surfaces and not on the thin side surfaces of the particles.

In embodiments, the particle 410 may be an aluminum particle having an aluminum oxide outer layer 412. Hence, in embodiments at least 30 wt. %, such as at least 50 wt. %, of the particles 410 comprise aluminum particles having an aluminum oxide outer layer 412.

As indicated above, the particles 410 may be reflective for at least part of the visible light and/or UV light. Especially, the particles may thus be reflective for one or more wavelengths selected from the range of 100-780 nm, especially 200-780 nm.

Figure 2E:
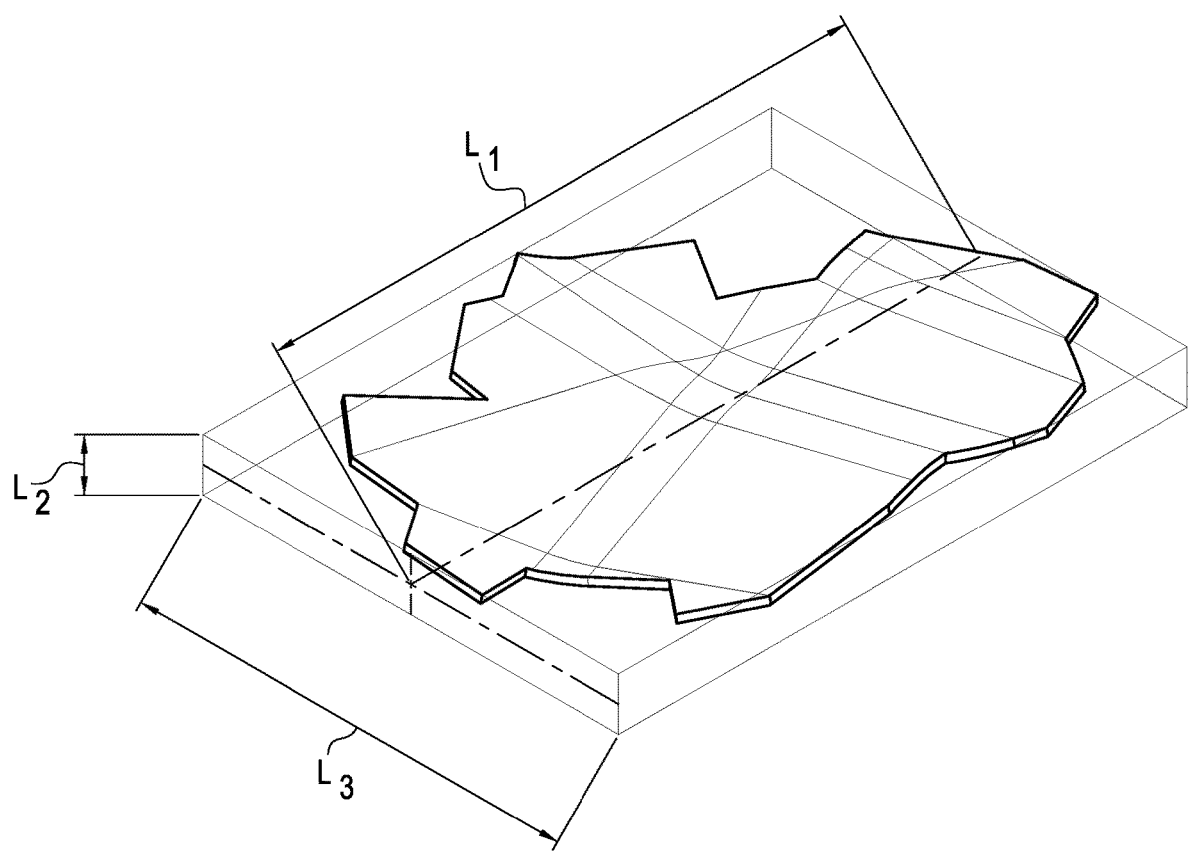

FIG. 2e schematically depicts a relatively irregularly shaped particle.

The particulate material may include a broad distribution of particles sizes.

A rectangular parallelepiped can be used to define the (orthogonal) dimensions with lengths L1, L2 and L3.

Figure 2F:
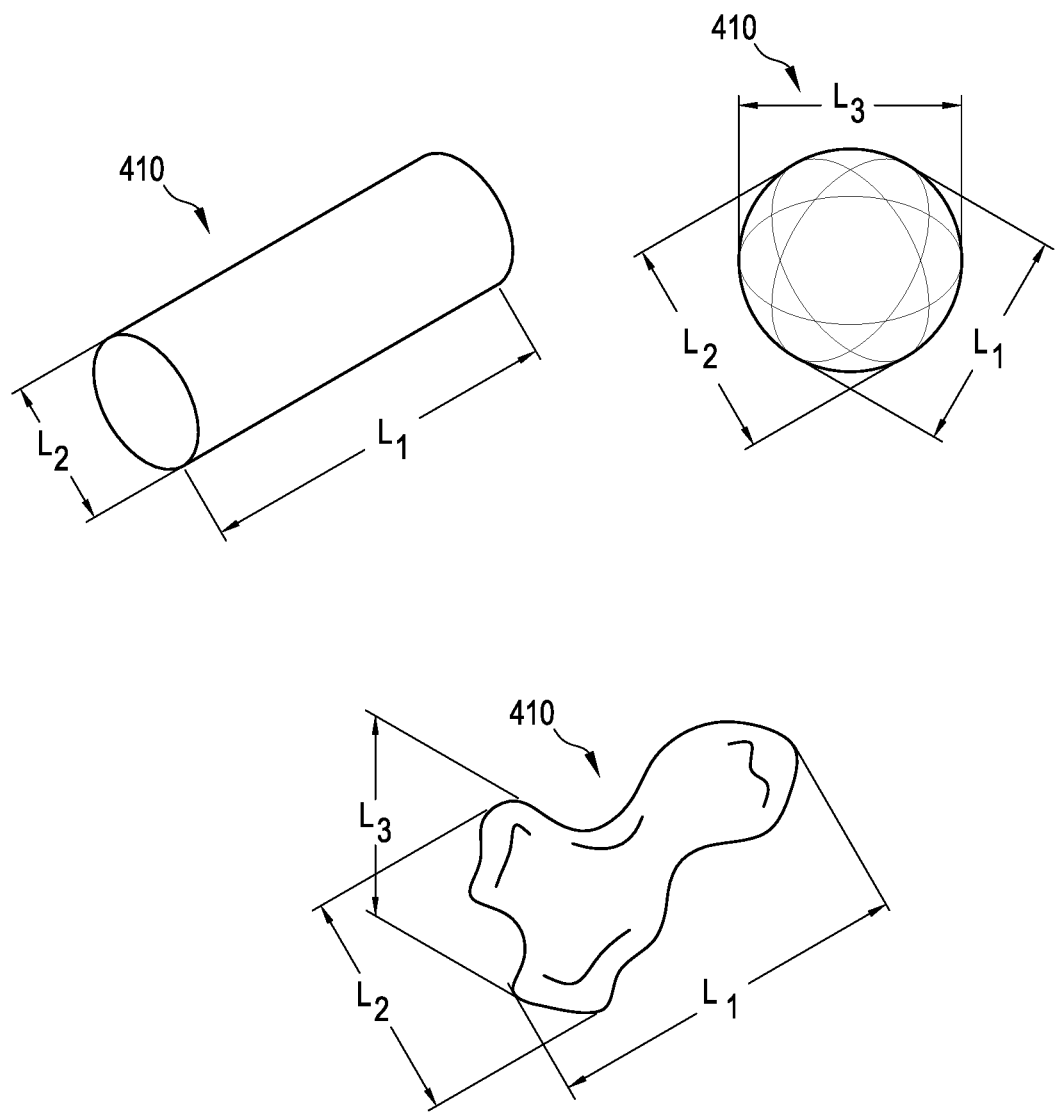

FIG. 2f schematically depicts cylindrical, spherical, and irregularly shaped particles, which will herein in general not be used (see also above).

As shown in FIGS. 2b-2f the terms "first dimension" or "longest dimension" especially refer to the length L1 of the smallest rectangular cuboid (rectangular parallelepiped) enclosing the irregular shaped particle. When the particle is essentially spherical the longest dimension L1, the shortest dimension L2, and the diameter are essentially the same.

As indicated above, the particles 410 have a particle length L1, a particle height L2, and a particle width L3. At least 30 wt. % of the particles may have a flake-like shape having a first aspect ratio AR1 defined as the ratio of the particle length L1 and the particle height L2 and having a second aspect ratio AR2 of the particle length L1 and the particle width L3. In embodiments, wherein AR1≥50 and/or 1≤AR2≤5.

In embodiments, for the at least 30 wt. %, such as at least 50 wt. %, the length L1 and the width L3 are individually selected from the range of 10-1000 μm. Further, in embodiments the particle height L2 is selected from the range of 20-500 nm.

As indicated above, especially the particles 410 have shapes selected from one or more of coin shapes and flake shapes, more especially flake shapes.

Figure 3:
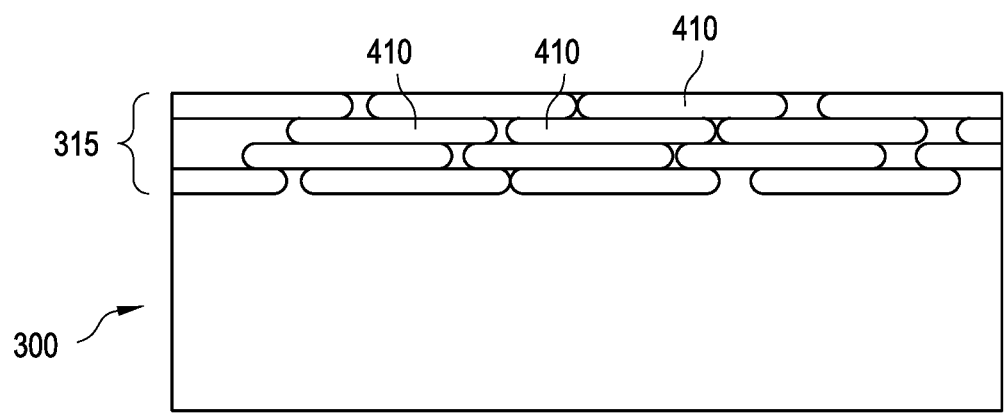
FIG. 3 schematically depict some aspects of the invention.

FIG. 3 schematically depicts an embodiment of a layer element 300 with flake-like particles 410, which are comprised in a layer 315. Here, the layered element 300 comprises a layer 315 which may comprise at least 30 wt. %, especially at least 50 wt. %, like e.g. at least 70 wt. %, of the light reflective particles 410. For instance, the layer 315 may have a particle concentration of at least 50 vol. %, such as at least 70 vol. %.

In embodiments, the layer 315 comprises a polymeric binder comprising layer comprising the reflective particles 410. Especially, the layer 315 comprises an epoxy layer comprising the reflective particles 410.

FIGS. 4a-4d (and in fact also FIG. 1), schematically depict embodiments of a lighting device 1000 comprising a light source 100 configured to generate light source light 101. The light source 100 comprises a solid state light source. As indicated above, the light source 100 may comprise a chip scale packaged LED. Further, the lighting device 1000 comprises a support 200 configured to support the light source 100. Especially, the support 200 comprises an aluminum based thermally conductive material 201. For instance, the support 200 may comprise a (metal based) printed circuit board. Hence, the support 200 may comprise in embodiments a metal based thermally conductive material 201.

The light source 100 and the support 200 are configured such that part of the light source light 101 during operation may be directed to the support 200.

Further, the lighting device 1000 comprises a layered element 300, configured in physical contact with the support 200. The layered element 300 comprises one or more layers 310.

In embodiments, the layered element 300 at least comprises an electrically insulating first layer 311, wherein at least part of the layered element 300 is configured between the light source 100 and the support 200. Hence, during operation part of the light source light 101 may irradiate the layered element 300. As schematically depicted (see FIGS. 4a-4c) the layered element 300 may comprise light reflective particles 410, wherein at least 30 wt. %, such as at least 70 wt. %, like at least 90 wt. %, of the particles have a flake-like shape.

Figure 4A:
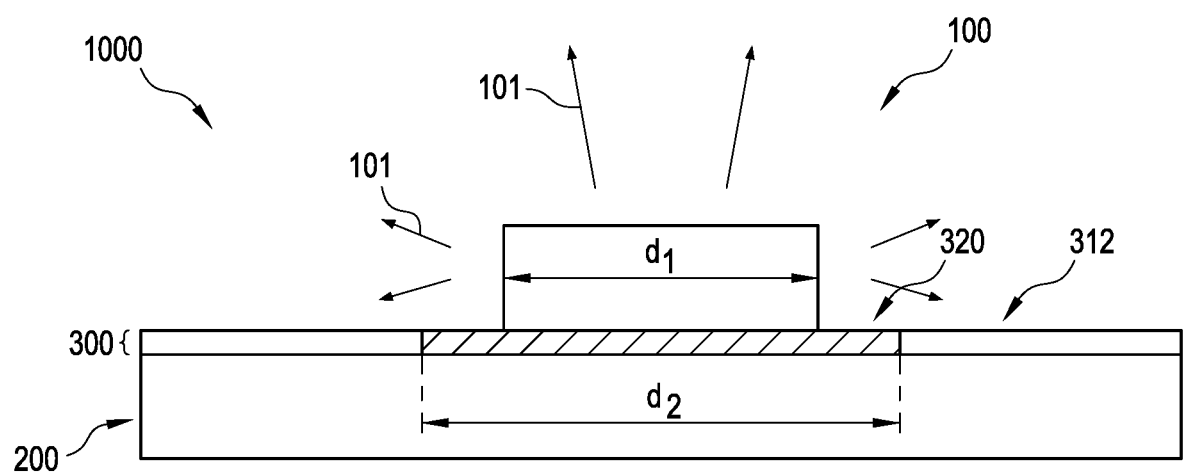
FIGS. 4a-4d schematically depict some aspects.
Figure 4B:
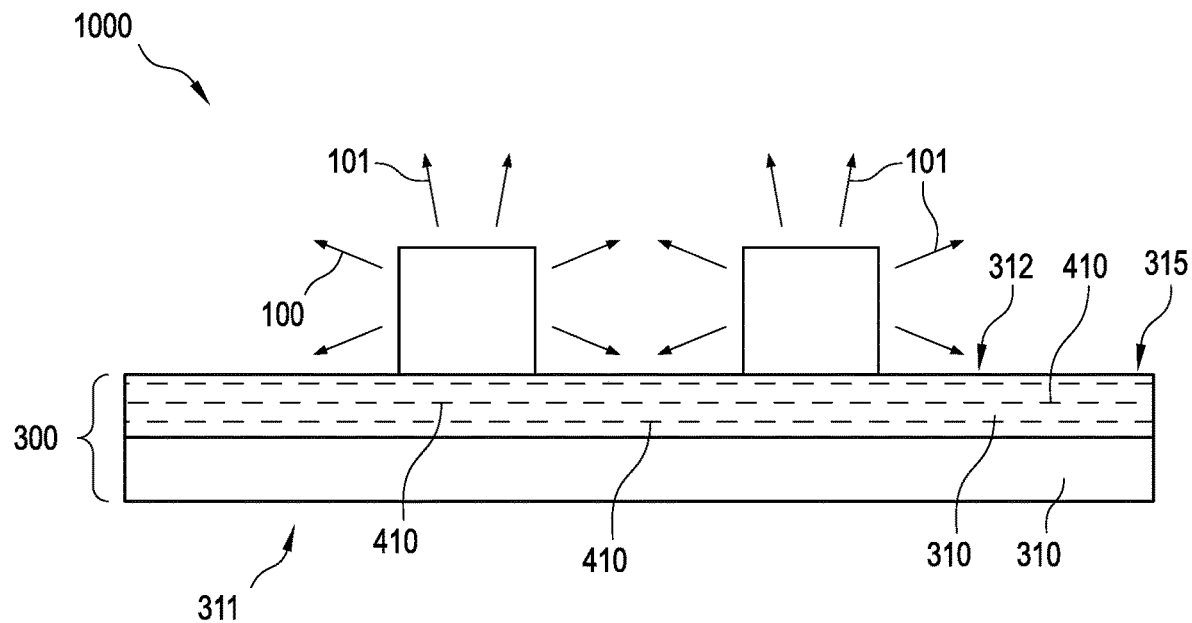
Figure 4C:
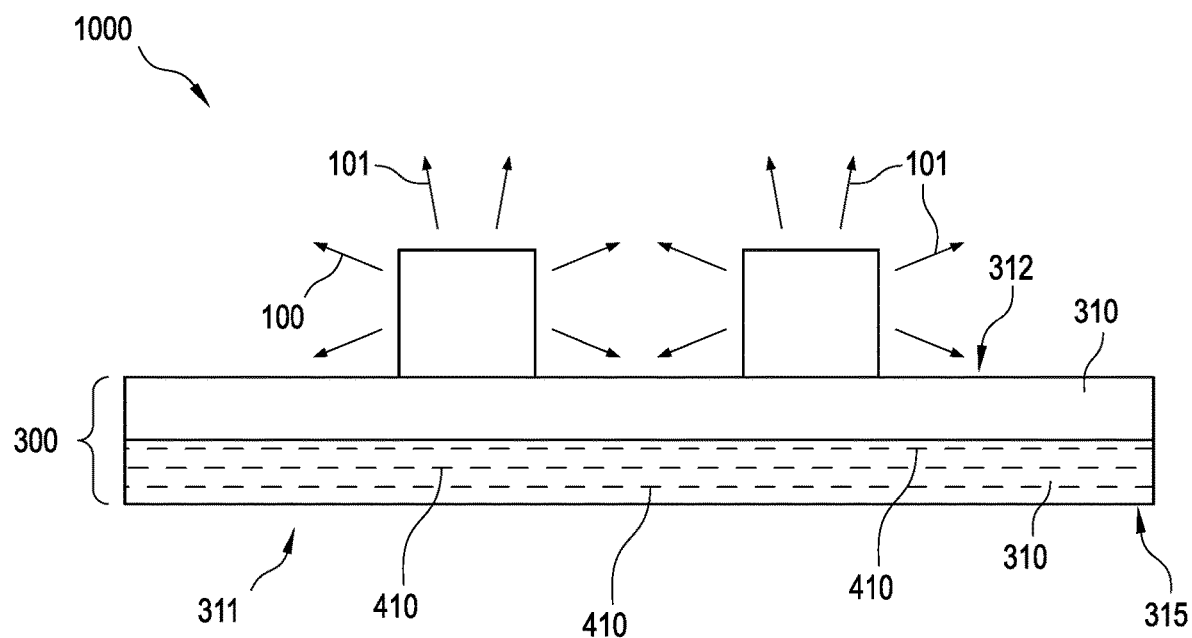
Figure 4D:
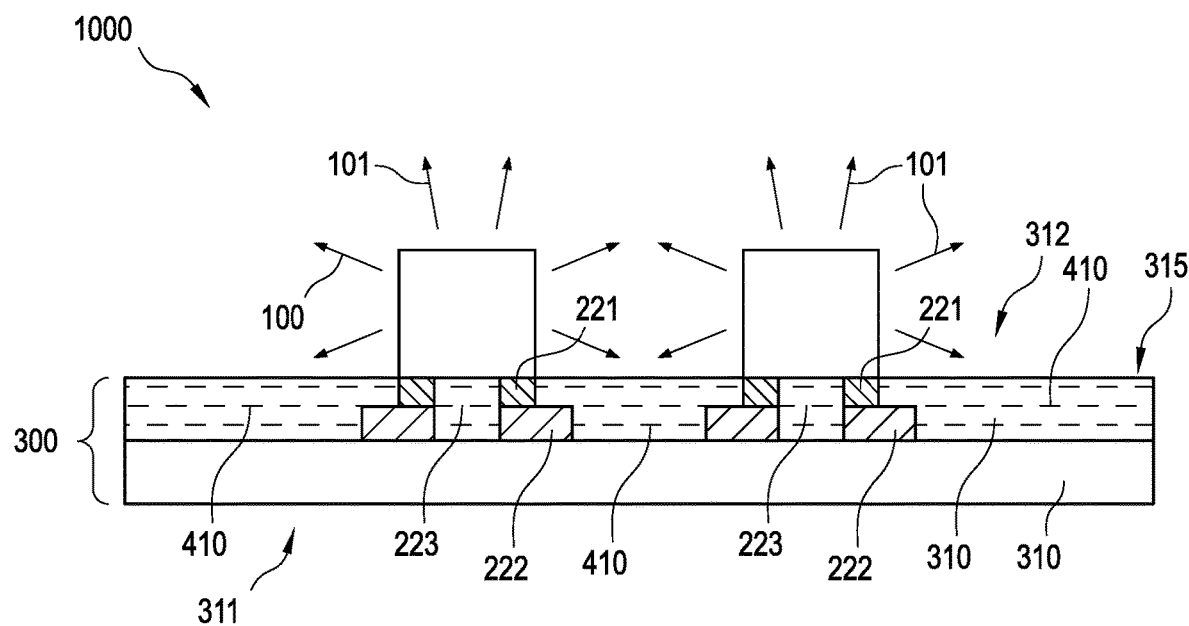

As schematically depicted in FIGS. 4b-4d (and FIG. 1), the layered element 300 may comprise the electrically insulating first layer 311 and a solder resist comprising second layer 312, wherein the insulating layer 311 is configured between the support 200 and the solder resist comprising second layer 312.

In embodiments, the solder resist comprising second layer 312 comprises the light reflective particles 410, see FIG. 4b. however, in other embodiments the electrically insulating first layer 311 comprises the light reflective particles 410. In yet further embodiments, both layers may comprise the light reflective particles.

As schematically depicted in FIG. 4a, the layered element 300 may comprise a layered element part 320 configured adjacent to the light source 100. The layered element part 320 comprises at least part of the total number of the particles having the flake-like shape. Reference d1 indicates the (circular equivalent) diameter of the light source 100 and reference d2 indicates the circular equivalent diameter of the layered element part 320. For the values of d1 and d2 may especially apply d2>d1. In general, a layer may comprise the reflective particles throughout the entire layer.

In FIG. 4d, an embodiment is schematically depicted wherein at least part of the one or more layers 310 occupies at least part of the space 223, and wherein that part of the one or more layers 310 comprises at least part of the total number of light reflective particles 410. Here, the space 223 may comprise part of the solder resist comprising second layer 312, though other variants may also be possible.

Figure 5:
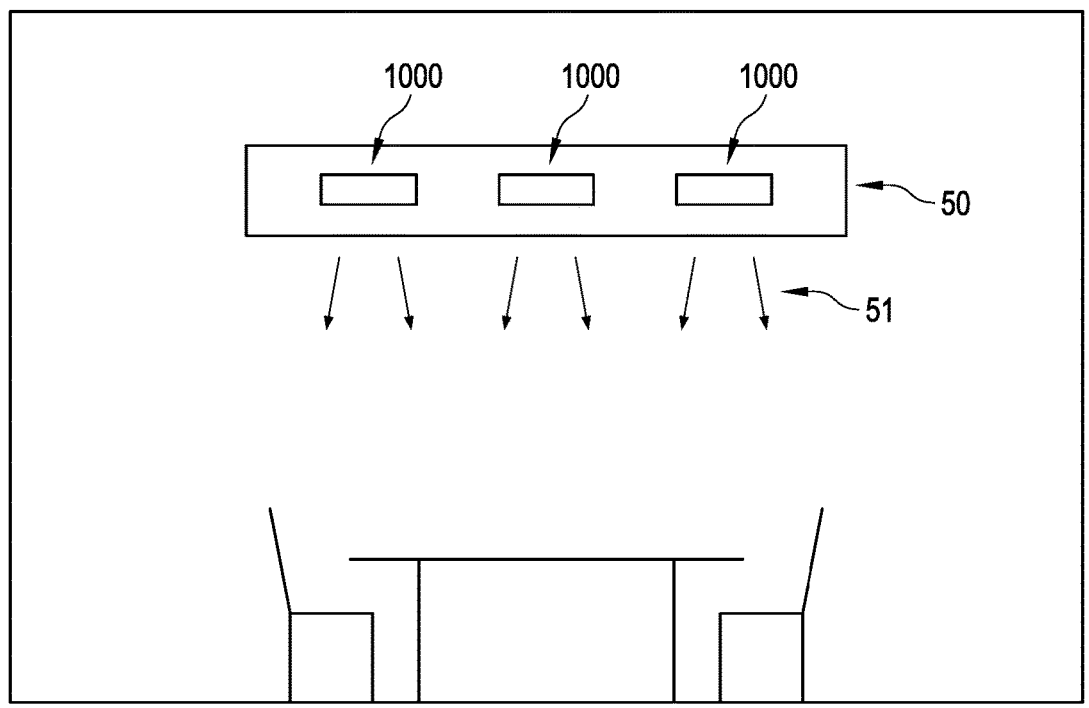
FIG. 5 schematically depicts a lamp or luminaire. The schematic drawings are not necessarily to scale.

FIG. 5 schematically depicts a light emitting element 50, such as a lamp or a luminaire, wherein the lamp or luminaire comprises the lighting device 1000. Here, by way of example the light emitting element 50 comprises a plurality of lighting devices 100. The light emitting element is configured to generate light emitting element light 51, which may essentially consist of the light source light.

In embodiments, the solder resist layer comprising the plate like particles can be patterned, such as by silk screening method. Alternatively or additionally, it may also be patterned using a photolithographic method (using a photo mask).

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A lighting device comprising (i) a light source configured to generate light source light, wherein the light source comprises a solid state light source, and (ii) a support configured to support the light source, wherein the support comprises a metal based thermally conductive material, wherein the lighting device further comprises (iii) a layered element, configured in physical contact with the support, wherein the layered element comprises one or more layers, wherein the layered element at least comprises an electrically insulating first layer, wherein at least part of the layered element is configured between the light source and the support such that during operation part of the light source light irradiates the layered element, wherein the layered element further comprises a layer of light reflective particles, wherein at least 30 wt, % of the particles have a flake-like shape and wherein the layer is an essentially closed layer of aligned flake-like shaped particles whereby essentially all light source light that is directed to the layered element is reflected back in a direction away from the support.

2. The lighting device according to claim 1, wherein the light source comprises a chip scale packaged LED.

3. The lighting device according to claim 1, wherein the layer comprises at least 80 wt. % of the light reflective particles, wherein the layer has a particle concentration of at least 50 vol %.

4. The lighting device according to claim 1, wherein the layer of light reflective particles comprises a polymeric binder comprising layer comprising the reflective particles.

5. The lighting device according to claim 1, wherein the layered element comprises the electrically insulating first layer and a solder resist comprising second layer, wherein the insulating layer is configured between the support and the solder resist comprising second layer, and wherein the solder resist comprising second layer comprises the light reflective particles.

6. The lighting device according claim 1, wherein the electrically insulating first layer comprises the light reflective particles.

7. The lighting device according to claim 1, further comprising two or more electrodes, wherein the light source and the two or more electrodes are functionally coupled, wherein between the two or more electrodes there is a space, wherein at least part of the one or more layers occupy at least part of the space, wherein the at least part of the one or more layers occupying the at least part of the space comprises at least part of the total number of light reflective particles.

8. The lighting device according to claim 3, wherein the particles are reflective for at least part of the visible light and/or UV light, wherein the particles have a particle length, a particle height, and a particle width, wherein the at least 50 wt. % of the particles have a first aspect ratio AR1 defined as the ratio of the particle length and the particle height, wherein $AR1 \geq 50$, and have a second aspect ratio AR2 of the particle length and the particle width, wherein $1 \leq AR2 \leq 5$.

9. The lighting device according to claim 3, wherein the particles have a particle length, a particle height, and a particle width, wherein for the at least 50 wt. % the length and the width are individually selected from the range of 10-1000 μm, and wherein the particle height is selected from the range of 20-500 nm.

10. The lighting device according to claim 1, wherein the particles have shapes selected from one or more of coin shapes and flake shapes.

11. The lighting device according to claim 3, wherein the at least 50 wt. % of the particles comprise aluminum particles having an aluminum oxide outer layer.

12. The lighting device according to claim 1, wherein the support comprises an aluminum based thermally conductive material.

13. The lighting device according to claim 1, wherein the support comprises a printed circuit board.

14. The lighting device according to claim 1, wherein the layered element comprises a layered element part configured adjacent to the light source, wherein the layered element part comprises at least part of the total number of the particles having the flake-like shape.

15. A lamp or a luminaire comprising the lighting device of claim 1.

* * * * *